United States Patent
Deng et al.

(10) Patent No.: US 10,387,533 B2
(45) Date of Patent: Aug. 20, 2019

(54) APPARATUS AND METHOD FOR GENERATING EFFICIENT CONVOLUTION

(71) Applicant: Samsung Electronics Co., Ltd., Gyeonggi-do (KR)

(72) Inventors: Weiran Deng, Woodland Hills, CA (US); Zhengping Ji, Temple City, CA (US)

(73) Assignee: Samsung Electronics Co., Ltd (KR)

( * ) Notice: Subject to any disclaimer, the term of this patent is extended or adjusted under 35 U.S.C. 154(b) by 0 days.

(21) Appl. No.: 15/611,342

(22) Filed: Jun. 1, 2017

(65) Prior Publication Data

US 2018/0349317 A1 Dec. 6, 2018

(51) Int. Cl.
| G06F 17/50 | (2006.01) |
| G06F 17/15 | (2006.01) |
| G06F 7/556 | (2006.01) |
| G06F 7/544 | (2006.01) |

(52) U.S. Cl.
CPC ............ *G06F 17/15* (2013.01); *G06F 7/5443* (2013.01); *G06F 7/556* (2013.01); *G06F 17/5081* (2013.01)

(58) Field of Classification Search
CPC ...... G06F 17/5081; G06F 17/15; G06F 7/556; G06F 17/16
See application file for complete search history.

(56) References Cited

U.S. PATENT DOCUMENTS

| 3,638,182 | A * | 1/1972 | Burton ................. H03M 13/17 375/254 |
| 5,926,580 | A | 7/1999 | McCoy |
| 6,295,373 | B1 | 9/2001 | Mahalanobis et al. |
| 6,574,649 | B2 | 6/2003 | McGrath |
| 7,882,164 | B1 | 2/2011 | French |
| 2011/0103236 | A1 | 5/2011 | Li |
| 2011/0271169 | A1* | 11/2011 | Pi ......................... H03M 13/09 714/807 |
| 2016/0062947 | A1 | 3/2016 | Chetlur et al. |
| 2016/0164537 | A1 | 6/2016 | Pisek et al. |
| 2016/0233963 | A1 | 8/2016 | Zhuge et al. |

OTHER PUBLICATIONS

Lavin, Andrew et al. "Fast Algorithms for Convolutional Neural Networks", arXiv:1509.09308v2 [cs.NE] Nov. 10, 2015, pp. 1-9.
Prado, Jacques, et al. "A Polynomial-Transform Based Computation of the 2-D DCT with Minimum Multiplicative Complexity", IEEE, 1996, pp. 1347-1350.
H.J. Nussbaumer, et al. "Computation of Convolutions and Discrete Fourier Transforms by Polynomial Transforms", IBM J. Res. Develop, vol. 22, No. 2, Mar. 1978, pp. 134-144.

* cited by examiner

*Primary Examiner* — Vuthe Siek
(74) *Attorney, Agent, or Firm* — The Farrell Law Firm, P.C.

(57) ABSTRACT

An apparatus and a method is provided. The apparatus includes a polynomial generator, including an input and an output; a first matrix generator, including an input connected to the output of the polynomial generator, and an output; a second matrix generator, including an input connected to the output of the first matrix generator, and an output; a third matrix generator, including a first input connected to the output of the first matrix generator, a second input connected to the output of the second matrix generator, and an output; and a convolution generator, including an input connected to the output of the third matrix generator, and an output.

18 Claims, 2 Drawing Sheets

APPARATUS AND METHOD FOR GENERATING EFFICIENT CONVOLUTION

FIELD

The present disclosure relates generally to an apparatus and method for generating a convolution, and more particularly, to an apparatus and method for generating an efficient convolution for a convolutional neural network (CNN).

BACKGROUND

Convolution operations in CNN for deep learning (DL) are computationally intensive and energy consuming. Convolution operations are one of the challenges in the proliferation of DL technology in commercial applications such as mobile devices and autonomous vehicles. Currently, there are published results demonstrating that performance of convolutions may be improved by using the Winograd theorem for convolutions for the purpose of training and as well as the inference of a CNN. However, these results do not address two important aspects of implementing CNN in commercial applications.

First, it is assumed that a transform of pre-trained kernels is carried out off-line and stored in a random access memory (RAM) for inference. Memory fetches of weights are slow and are much more energy consuming than arithmetic operations, which is why pruning and compressing of pre-trained weights are being researched in the DL community. In addition, a kernel transform may reduce the compression efficiency of the weights.

Second, the precision of the Winograd theorem for convolution is important for the implementation of CNN in a fixed-point format. The division of weights in kernel transforms, rounding, and rescaling may lead to a loss of arithmetic accuracy.

Thus, there is a need to address performance and accuracy associated with convolution.

A one-dimensional linear convolution may be expressed as $y=g \otimes d$, where y is an output, g is a kernel, d is input data, and $\otimes$ is a convolution operation. CNN convolution kernels g may be small (e.g., 1×1, 3×3, 5×5, 7×7, etc.). The linear convolution is equivalent to $y=B\{((Gg) \odot (Ad))\}$ according to the Winograd short convolution theorem, where B, G, and A are matrices, $\odot$ is an element-wise multiplication operation. G is applied to the kernel g to perform a kernel transform, and A is applied to the data d to perform a data transform.

Current technologies may be based on the Cook-Toom algorithm or the Winograd algorithm. These algorithms reduce the number of multiplications by increasing the number of additions, because addition is computationally faster and less energy consuming than multiplication. Technologies based on the Cook-Toom algorithm and the Winograd algorithm are superior to direct convolution if weights are pre-calculated and stored for off-line inference use.

Arithmetic complexity may be further reduced for a two dimensional (2D) convolution expressed as $y=B\{(GgG^T) \odot (AdA^T)\}B^T$, where T represents a matrix transpose operation. 2D convolution has recently been investigated and demonstrated to have advantages for CNN applications, where a kernel transform may be computed off-line and stored for later use in CNN inference applications. However, there are two drawbacks with such an implementation.

First, current state-of-art CNN models may have many layers and a large number of weights. Data fetched from stored weights may lead to high latency and energy consumption. Pre-computation and storing of transformed weights may work for a training stage that typically runs on a high-performance server but may be impractical for CNN inferences. In practice, weights are often pruned, quantized to eight or less bits in fixed-point, and compressed to save storage and reduce the number of data fetches. For example, in a two-dimensional F(4×4,3×3) convolution, an original kernel size is 3×3. However, after kernel transform, a new kernel to be stored is 6×6. Even though the number of computations is reduced, the kernel size quadrupled.

Second, a kernel transform of weights in fixed-point involves division, which may lead to a loss of arithmetic accuracy. For example, in an F(4×4,3×3) convolution, a kernel transform may require the division of the weights by 6, 12, and 24. In a fixed-point implementation, this leads to a loss of arithmetic accuracy.

The choice of polynomials used with the Winograd algorithm determines the elements in matrices A, B, and G. The Winograd algorithm requires that moduli be relatively co-prime with respect to each other. The degree, length, and coefficients of the polynomials determine the values of the elements of A, B, and G.

The Winograd algorithm includes a convolution expressed as polynomial $s(x)=g(x)d(x) \% M(x)$, where $s(x)$ is an output, $g(x)$ is a kernel, $d(x)$ is input data, % denotes modulo reduction, and $M(x)$ are polynomials.

Polynomials $m_i(x)$ are selected such that $M(x)=\Pi_{i=0}^{K-1}m_i(x)$, all of the $m_i(x)$ are relatively co-prime, and $M(x)$ is a degree higher than $s(x)$, where K is the number of the selected co-prime polynomials.

Kernels $g_i(x)$ are calculated such that $g_i(x)=g(x) \% m_i(x)$.
Data $d_i(x)$ are calculated such that $d_i(x)=d(x) \% m_i(x)$.
Outputs $s_i(x)$ are calculated such that $s_i(x)=g(x)d(x) \% m_i(x)=g_i(x)d_i(x) \% m_i(x)$.

Output $s(x)$ is calculated using the Chinese Remainder Theorem (CRT) such that $s(x)=\Sigma_{i=0}^{K-1}s_i(x)N_i(x)M_i(x) \% M(x)$, where $M_i(x)=M(x)/m_i(x)$, $N_i(x)M_i(x)+n_i(x)m_i(x)=1$, and $N_i(x)$ and $M_i(x)$ are calculated using the extended Euclidean algorithm since $N_i(x)$ and $M_i(x)$ are co-prime and their Greatest Common Divisor (GCD) is 1.

SUMMARY

According to one embodiment, an apparatus includes a polynomial generator, including an input and an output; a first matrix generator, including an input connected to the output of the polynomial generator, and an output; a second matrix generator, including an input connected to the output of the first matrix generator, and an output; a third matrix generator, including a first input connected to the output of the first matrix generator, a second input connected to the output of the second matrix generator, and an output; and a convolution generator, including an input connected to the output of the third matrix generator, and an output.

According to one embodiment, a method includes generating, by a polynomial generator, K co-prime polynomials $m_i(x)$ of the form x or $x^n \pm 1$ for a convolution expressed as polynomial $s(x)=g(x) \otimes d(x)$ of degree N such that $\Sigma_{i=0}^{K-1}n_i=N-1$, where $s(x)$ is an output, $g(x)$ is a kernel, $d(x)$ is input data, N is an integer, and K is an integer; generating, by a first matrix generator, if an order of $m_i(x)$ is greater than 1, a matrix P, for an order lower than that of $m_i(x)$, linear row combinations are generated for the matrix P, and these operations are repeated until the degree N of $m_1(x)$ is 1; generating, by a second matrix generator, a matrix Q; generating, by a third matrix generator, matrices B=PQ, A, and G; and generating, by a convolution generator, a convolution expressed as y=B{((Gg)⊙(Ad))}.

According to one embodiment, a method of manufacturing an apparatus includes forming the apparatus on a wafer or a package with at least one other apparatus, wherein the apparatus includes a polynomial generator, a first matrix generator, a second matrix generator, a third matrix generator, and a convolution generator, and testing the apparatus, wherein testing the apparatus includes testing the apparatus using one or more electrical to optical converters, one or more optical splitters that split an optical signal into two or more optical signals, and one or more optical to electrical converters.

According to one embodiment, a method of constructing an integrated circuit includes generating a mask layout for a set of features for a layer of the integrated circuit, wherein the mask layout includes standard cell library macros for one or more circuit features that include an apparatus that includes a polynomial generator, a first matrix generator, a second matrix generator, a third matrix generator, and a convolution generator; disregarding relative positions of the macros for compliance to layout design rules during the generation of the mask layout; checking the relative positions of the macros for compliance to layout design rules after generating the mask layout; upon detection of noncompliance with the layout design rules by any of the macros, modifying the mask layout by modifying each of the noncompliant macros to comply with the layout design rules; generating a mask according to the modified mask layout with the set of features for the layer of the integrated circuit; and manufacturing the integrated circuit layer according to the mask.

BRIEF DESCRIPTION OF THE DRAWINGS

The above and other aspects, features, and advantages of certain embodiments of the present disclosure will be more apparent from the following detailed description, taken in conjunction with the accompanying drawings, in which.

DETAILED DESCRIPTION OF EMBODIMENTS OF THE PRESENT DISCLOSURE

Figure 1:
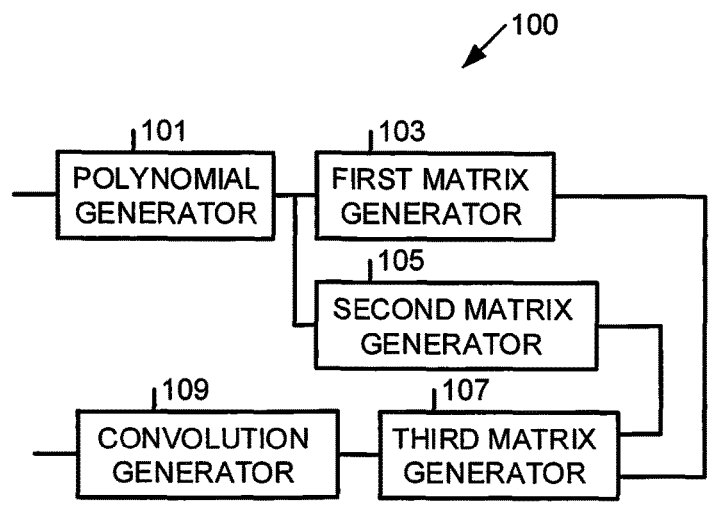
FIG. 1 illustrates an exemplary block diagram of an apparatus for generating an efficient convolution, according to one embodiment.

Hereinafter, embodiments of the present disclosure are described in detail with reference to the accompanying drawings. It should be noted that the same elements will be designated by the same reference numerals although they are shown in different drawings. In the following description, specific details such as detailed configurations and components are merely provided to assist with the overall understanding of the embodiments of the present disclosure. Therefore, it should be apparent to those skilled in the art that various changes and modifications of the embodiments described herein may be made without departing from the scope of the present disclosure. In addition, descriptions of well-known functions and constructions are omitted for clarity and conciseness. The terms described below are terms defined in consideration of the functions in the present disclosure, and may be different according to users, intentions of the users, or customs. Therefore, the definitions of the terms should be determined based on the contents throughout this specification.

The present disclosure may have various modifications and various embodiments, among which embodiments are described below in detail with reference to the accompanying drawings. However, it should be understood that the present disclosure is not limited to the embodiments, but includes all modifications, equivalents, and alternatives within the scope of the present disclosure.

Although the terms including an ordinal number such as first, second, etc. may be used for describing various elements, the structural elements are not restricted by the terms. The terms are only used to distinguish one element from another element. For example, without departing from the scope of the present disclosure, a first structural element may be referred to as a second structural element. Similarly, the second structural element may also be referred to as the first structural element. As used herein, the term "and/or" includes any and all combinations of one or more associated items.

The terms used herein are merely used to describe various embodiments of the present disclosure but are not intended to limit the present disclosure. Singular forms are intended to include plural forms unless the context clearly indicates otherwise. In the present disclosure, it should be understood that the terms "include" or "have" indicate existence of a feature, a number, a step, an operation, a structural element, parts, or a combination thereof, and do not exclude the existence or probability of the addition of one or more other features, numerals, steps, operations, structural elements, parts, or combinations thereof.

Unless defined differently, all terms used herein have the same meanings as those understood by a person skilled in the art to which the present disclosure belongs. Such terms as those defined in a generally used dictionary are to be interpreted to have the same meanings as the contextual meanings in the relevant field of art, and are not to be interpreted to have ideal or excessively formal meanings unless clearly defined in the present disclosure.

The present disclosure concerns an apparatus and a method for generating a convolution that includes fast and efficient computations. The present disclosure may be used for CNN, but is not limited thereto.

A one-dimensional linear convolution expressed as y=g⊗d is equivalent to y=B{(Gg)⊙(Ad))} according to the Winograd short convolution theorem. In one embodiment, the present disclosure uses high order co-prime polynomials with coefficients of one and calculates a sub-matrix for the high order polynomials. Thus, only small integer values are included in matrices A and B. In addition, the values in matrix G are each a power of two. Therefore, the number of multiplications in transforms involving matrices A and B (e.g., data transformations and inverse transformations) are completely replaced by additions. Furthermore, divisions in kernel transform Gg are replaced by bit shifting.

The present disclosure reduces the number of multiplications in the data transformations and inverse transformations. Division is replaced in the kernel transformation with bit shifting, which increases computation speed without a loss of arithmetic accuracy.

In one embodiment, a method generates a convolution algorithm that reduces the number of multiplications and preserves arithmetic accuracy for a fixed-point implementation of a CNN inference. However, the present disclosure is not limited thereto.

Values in matrices A and B may be small such that they may be expressed using addition instead of multiplication. For example, an arithmetic operation such as $2*x_1+1*x_2+2*x_3$ may be expressed as $x_1+x_1+x_2+x_3+x_3$ to eliminate the multiplication operations. Heuristically, polynomials with only coefficients having a value of one such as x and x+/−1 lead to matrices with desired elements. Higher order polynomials such as $x^n+1$ may be used. The generation of transform matrices using higher order polynomials is more complex and, therefore, is not used in current technologies.

In one embodiment, matrix elements are generated using polynomials with lower order polynomials that have the equivalent order of a product. For example, an F(2,2) linear convolution $s_1(x)=g(x)d(x)$ % $(x(x+1))$, is equivalent to $s_2(x)=g(x)d(x)$ % $(x^2+1)$. The elements in matrices A, B, and G in $s_2(x)$ may, therefore, be generated from $s_1(x)$. Thus, $s_1$ may be preserved in the new matrices for $s_2$.

In one embodiment, division of integers is avoided by using denominators that are a power of two such that division may be replaced with bit shifting, which is more computationally efficient than integer division, and preserves arithmetic accuracy.

FIG. 1 illustrates an exemplary block diagram of an apparatus 100 for generating an efficient convolution, according to one embodiment. The apparatus may generate the efficient convolution for a CNN. However, the present disclosure is not limited thereto.

Referring to FIG. 1, the apparatus 100 includes a polynomial generator 101, a first matrix generator 103, a second matrix generator 105, a third matrix generator 107, and a convolution generator 109.

The polynomial generator 101, includes an input for receiving all of the necessary parameters for generating K co-prime polynomials $m_i(x)$ of the form x or $x^n±1$ such that $\Sigma_{i=0}^{K-1}n_i=N-1$, and an output for outputting the generated $m_i(x)$ polynomials. The $m_i(x)$ polynomials are expressed as $s(x)=g(x)\otimes d(x)$ of degree N, where s(x) is an output, g(x) is a kernel, d(x) is input data, N is an integer, K is an integer, and n is an integer. A high order polynomial of the form $x^n±1$ may be used to generate a cyclic convolution matrix where an upper right half of the kernel matrix g is negative.

The first matrix generator 103 includes an input connected to the output of the polynomial generator 101, and an output. The first matrix generator 103, if the order of $m_i(x)$ is greater than 1, is configured to generate a matrix P for an order lower than that of $m_i(x)$ using the Winograd algorithm, generate linear row combinations for the matrix P, and repeat these operations until the degree N of $m_i(x)$ is 1. The cyclic convolution matrix may be transformed from a linear convolution matrix through a series of linear convolutions. The linear convolutions corresponding to the linear convolution matrix is generated using the Winograd algorithm. The linear transform is applied to a corresponding sub-matrix B as $P_i$. In one embodiment, the operation of the first matrix generator 103 is repeated until $x^n±1$ is x+1, x−1, or $x^2+1$. For example, a short convolution with a length less than 7 may require only one iteration.

The second matrix generator 105 includes an input connected to the output of the polynomial generator 101, and an output. The second matrix generator 105 is configured to generate a matrix Q using the Winograd algorithm.

The third matrix generator 107 includes a first input connected to the output of the first matrix generator 103, a second input connected to the output of the second matrix generator 105, and an output. The third matrix generator 107 is configured to generate matrices B=PQ, A, and G.

The convolution generator 109 includes an input connected to the output of the third matrix generator 107, and an output. The convolution generator 109 is configured to generate the efficient convolution expressed as $y=B\{((Gg)\odot(Ad))\}$.

Figure 2:
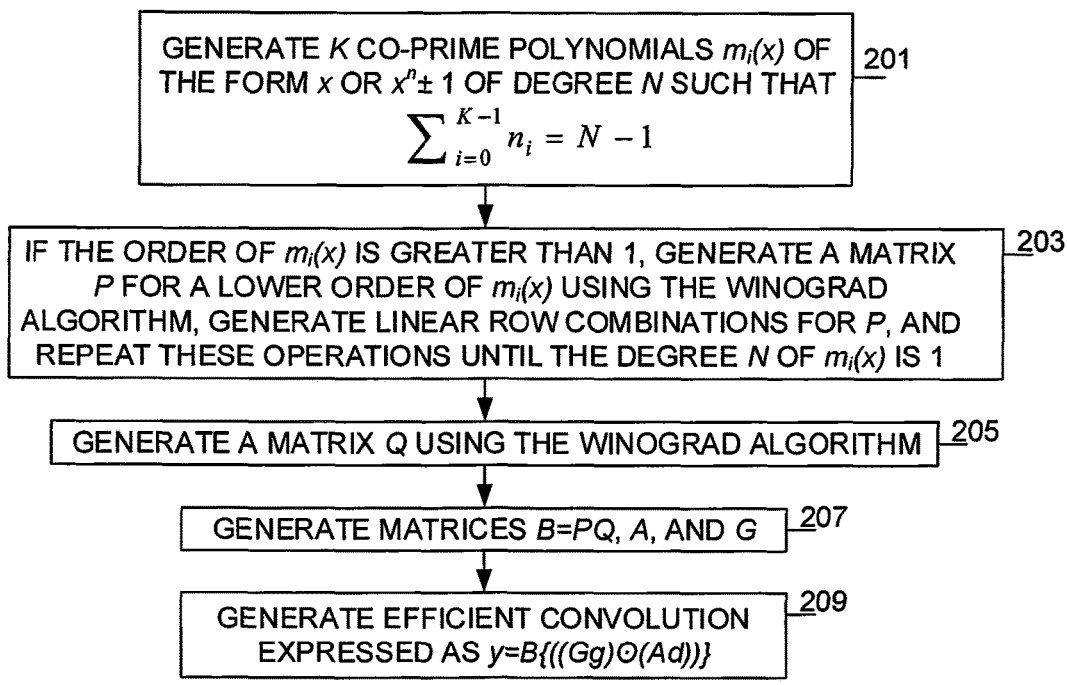
FIG. 2 illustrates an exemplary flowchart of a method of generating an efficient convolution, according to one embodiment.

FIG. 2 illustrates an exemplary flowchart of a method of generating an efficient convolution, according to one embodiment. The method may generate the efficient convolution for a CNN. However, the present disclosure is not limited thereto.

Referring to FIG. 2, K co-prime polynomials $m_i(x)$ of the form x or $x^n±1$ are generated, by a polynomial generator, for a convolution expressed as polynomial $s(x)=g(x)\otimes d(x)$ of degree N such that $\Sigma_{i=0}^{K-1}n_i=N-1$, where s (x) is an output, g(x) is a kernel, d(x) is input data, N is an integer, and K is an integer, at step 201. A high order polynomial of the form $x^n±1$ may be used to generate a cyclic convolution matrix where an upper right half of the kernel matrix g is negative.

At step 203, if the order of $m_i(x)$ is greater than 1, a matrix P is generated, by a first matrix generator, using the Winograd algorithm for an order lower than that of $m_i(x)$, linear row combinations are generated for the matrix P, and these operations are repeated until the degree N of $m_i(x)$ is 1. The cyclic convolution matrix may be transformed from a linear convolution matrix through a series of linear convolutions. The linear convolutions corresponding to the linear convolution matrix may be generated using the Winograd algorithm. The linear transform is applied to a corresponding sub-matrix B as $P_i$. In one embodiment, step 203 is repeated until $x^n±1$ is x+1, x−1, or $x^2+1$. For example, a short convolution with a length less than 7 may require only one iteration.

At step 205, a matrix Q is generated by a second matrix generator. In one embodiment, the matrix Q may be generated using the Winograd algorithm.

At step 209, matrices B=PQ, A, and G are generated by a third matrix generator.

At step 211, the efficient convolution expressed as $y=B\{((Gg)\odot(Ad))\}$ is generated by a convolution generator.

Figure 3:
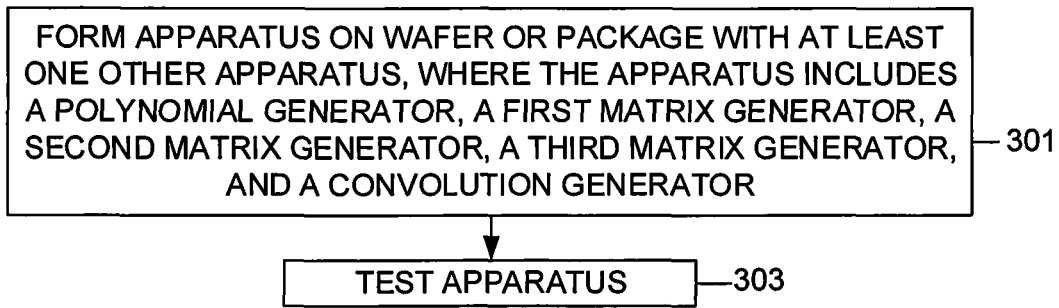
FIG. 3 illustrates an exemplary flowchart of a method of manufacturing an apparatus for generating an efficient convolution, according to one embodiment.

FIG. 3 illustrates an exemplary flowchart of a method of manufacturing an apparatus for generating an efficient convolution, according to one embodiment.

Referring to FIG. 3, an apparatus is formed on a wafer or a package with at least one other apparatus, where the apparatus includes a first polynomial generator, a first matrix generator, a second matrix generator, a third matrix generator, and a convolution generator, at 301.

At 302, the apparatus is tested. Testing the apparatus may include testing the apparatus using one or more electrical to optical converters, one or more optical splitters that split an optical signal into two or more optical signals, and one or more optical to electrical converters.

Figure 4:
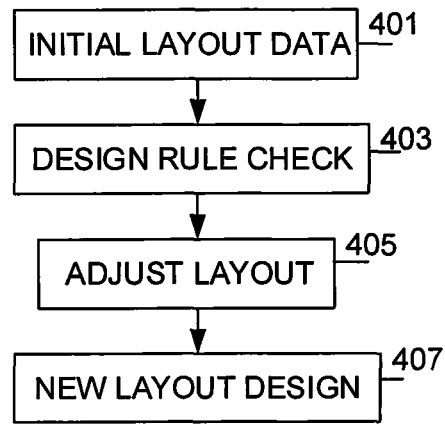
FIG. 4 illustrates an exemplary flowchart of a method of constructing an integrated circuit, according to one embodiment.

FIG. 4 illustrates an exemplary flowchart of a method of constructing an integrated circuit, according to one embodiment.

Referring to FIG. 4, initial layout data is constructed in 401. For example, a mask layout is generated for a set of features for a layer of the integrated circuit, wherein the mask layout includes standard cell library macros for one or more circuit features that include an apparatus that includes a polynomial generator, a first matrix generator, a second matrix generator, a third matrix generator, and a convolution generator, and disregarding relative positions of the macros for compliance to layout design rules during the generation of the mask layout.

At 403, a design rule check is performed. For example, the method may check the relative positions of the macros for compliance to layout design rules after generating the mask layout.

At 405, the layout is adjusted. For example, the method, upon detection of noncompliance with the layout design rules by any of the macros, may modify the mask layout by modifying each of the noncompliant macros to comply with the layout design rules.

At 407, new layout data is generated. For example, the method may generate a mask according to the modified mask layout with the set of features for the layer of the integrated circuit. Then, the integrated circuit layer according to the mask may be manufactured.

Although certain embodiments of the present disclosure have been described in the detailed description of the present disclosure, the present disclosure may be modified in various forms without departing from the scope of the present disclosure. Thus, the scope of the present disclosure shall not be determined merely based on the described embodiments, but rather determined based on the accompanying claims and equivalents thereto.

What is claimed is:

1. An apparatus, comprising:
   a polynomial generator, including an input and an output;
   a first matrix generator, including an input connected to the output of the polynomial generator, and an output;
   a second matrix generator, including an input connected to the output of the first matrix generator, and an output;
   a third matrix generator, including a first input connected to the output of the first matrix generator, a second input connected to the output of the second matrix generator, and an output; and
   a convolution generator, including an input connected to the output of the third matrix generator, and an output.

2. The apparatus of claim 1, wherein the polynomial generator is configured to generate K co-prime polynomials $m_i(x)$ of the form x or $x^n \pm 1$ such that $\Sigma_{i=0}^{K-1} n_i = N-1$, where N is an integer, K is an integer, and n is an integer.

3. The apparatus of claim 2, wherein the polynomial generator is further configured such that the $m_i(x)$ polynomials are expressed as $s'(x) = g(x) \otimes d(x)$ of degree N, where s(x) is an output, g(x) is a kernel, d(x) is input data.

4. The apparatus of claim 2, wherein the polynomial generator is further configured to generate a cyclic convolution matrix where an upper right half of the kernel matrix g is negative.

5. The apparatus of claim 3, wherein the first matrix generator, if the order of $m_i(x)$ is greater than 1, is configured to generate a matrix P for an order lower than that of $m_i(x)$ using a Winograd algorithm, generate linear row combinations for the matrix P, and repeat these operations until the degree N of $m_i(x)$ is 1.

6. The apparatus of claim 5, wherein the first matrix generator is further configured to transform the matric P from a linear convolution matrix through a series of linear convolutions.

7. The apparatus of claim 6, wherein the first matrix generator is further configured to transform the matrix P using the Winograd algorithm.

8. The apparatus of claim 7, wherein the first matrix generator is further configured to repeat its operations until $x^n \pm 1$ is x+1, x−1, or $x^2+1$.

9. The apparatus of claim 6, wherein the second matrix generator is configured to generate a matrix Q using the Winograd algorithm.

10. The apparatus of claim 9, wherein the third matrix generator is configure to generate matrices B=PQ, A, and G.

11. The apparatus of claim 10, wherein the convolution generator is configured to generate a convolution expressed as $y = B\{((Gg) \odot (Ad))\}$.

12. A method, comprising:
   generating, by a polynomial generator, K co-prime polynomials $m_i(x)$ of the form x or $x^n \pm 1$ for a convolution expressed as polynomial $s(x) = g(x) \otimes d(x)$ of degree N such that $\Sigma_{i=0}^{K-1} n_i = N-1$, where s(x) is an output, g(x) is a kernel, d(x) is input data, N is an integer, and K is an integer;
   generating, by a first matrix generator, if an order of $m_i(x)$ is greater than 1, a matrix P, for an order lower than that of $m_i(x)$, linear row combinations are generated for the matrix P, and these operations are repeated until the degree N of $m_i(x)$ is 1;
   generating, by a second matrix generator, a matrix Q;
   generating, by a third matrix generator, matrices B=PQ, A, and G; and
   generating, by a convolution generator, a convolution expressed as $y = B\{((Gg) \odot (Ad))\}$.

13. The method of claim 12, wherein the matrix P is generating using a Winograd algorithm.

14. The method of claim 12, wherein generating, by the polynomial generator, K co-prime polynomials $m_i(x)$ is comprised of generating for a high order polynomial of the form $x^n \pm 1$ a cyclic convolution matrix where an upper right half of the kernel matrix g is negative.

15. The method of claim 13, wherein the cyclic convolution matrix may be transformed from a linear convolution matrix through a series of linear convolutions.

16. The method of claim 14, wherein the linear convolutions corresponding to the linear convolution matrix are generated using a Winograd algorithm.

17. The method of claim 12, wherein the matrix P is generated such that $x^n \pm 1$ is x+1, x−1, or $x^2+1$.

18. The method of claim 12, wherein the matrix Q is generated using a Winograd algorithm.

* * * * *